(12) United States Patent
Dunworth et al.

(10) Patent No.: US 8,019,301 B2
(45) Date of Patent: *Sep. 13, 2011

(54) CALIBRATION TECHNIQUES FOR FREQUENCY SYNTHESIZERS

(75) Inventors: Jeremy D. Dunworth, San Diego, CA (US); Brett C. Walker, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 517 days.

This patent is subject to a terminal disclaimer.

(21) Appl. No.: 12/140,523

(22) Filed: Jun. 17, 2008

(65) Prior Publication Data

US 2008/0248771 A1    Oct. 9, 2008

Related U.S. Application Data

(62) Division of application No. 10/092,669, filed on Mar. 6, 2002, now Pat. No. 7,546,097.

(51) Int. Cl.
*H04B 1/06* (2006.01)
*H04B 7/00* (2006.01)
(52) U.S. Cl. .......... 455/260; 455/258; 455/76; 455/118; 455/323
(58) Field of Classification Search .......... 455/258, 455/260, 76, 118, 323
See application file for complete search history.

(56) References Cited

U.S. PATENT DOCUMENTS

| 4,087,750 A | 5/1978 | Allen et al. |
| 4,313,209 A | 1/1982 | Drucker |
| 4,454,483 A | 6/1984 | Baylor |
| 4,746,879 A | 5/1988 | Ma et al. |
| 4,792,768 A | 12/1988 | Fried et al. |
| 4,910,473 A | 3/1990 | Niwa |
| 4,940,950 A | 7/1990 | Helfrick |
| 5,023,572 A | 6/1991 | Caldwell et al. |
| 5,079,522 A | 1/1992 | Owen et al. |
| 5,150,082 A | 9/1992 | Grimmett et al. |
| 5,182,528 A | 1/1993 | Zuta |
| 5,335,365 A | 8/1994 | Ballantyne et al. |
| 5,382,922 A | 1/1995 | Gersbach et al. |

(Continued)

FOREIGN PATENT DOCUMENTS

EP    0423941    9/1990

(Continued)

OTHER PUBLICATIONS

Lin, et al. "A 900-MHz 2.5-mA CMOS Frequency Synthesizer with an Automatic SC Tuning Loop", IEEE Journal of Solid-State Circuits, vol. 36, No. 3, Mar. 2001 pp. 424-431.

(Continued)

*Primary Examiner* — Lewis West
(74) *Attorney, Agent, or Firm* — Jonathan T. Velasco

(57) ABSTRACT

In one embodiment, this disclosure describes a frequency synthesizer for use in a wireless communication device, or similar device that requires precision frequency synthesis but small amounts of noise. In particular, the frequency synthesizer may include a phase locked loop (PLL) and an integrated voltage controlled oscillator (VCO). The frequency synthesizer may implement one or more calibration techniques to quickly and precisely calibrate the VCO. In this manner, the analog gain of the VCO can be significantly reduced, which may improve performance of the wireless communication device. Also, the initial state of the PLL may be improved to reduce lock time of the PLL, which may enhance performance of the wireless communication device.

29 Claims, 9 Drawing Sheets

U.S. PATENT DOCUMENTS

| | | | |
|---|---|---|---|
| 5,473,284 A | | 12/1995 | Jantti et al. |
| 5,477,194 A | * | 12/1995 | Nagakura ................. 331/10 |
| 5,493,710 A | | 2/1996 | Takahara et al. |
| 5,509,034 A | | 4/1996 | Beukema |
| 5,604,465 A | | 2/1997 | Farabaugh |
| 5,604,468 A | * | 2/1997 | Gillig ..................... 331/176 |
| 5,774,555 A | * | 6/1998 | Lee et al. ..................... 381/4 |
| 5,787,134 A | * | 7/1998 | Kovacs .................. 375/376 |
| 5,828,266 A | | 10/1998 | Couet |
| 5,831,485 A | | 11/1998 | Nelson et al. |
| 5,870,001 A | | 2/1999 | Osterling et al. |
| 5,892,408 A | | 4/1999 | Binder |
| 5,926,515 A | | 7/1999 | Park |
| 6,016,081 A | | 1/2000 | O'Shaughnessy |
| 6,023,198 A | | 2/2000 | McKinney et al. |
| 6,064,947 A | | 5/2000 | Sun et al. |
| 6,133,797 A | | 10/2000 | Lovelace et al. |
| 6,137,372 A | | 10/2000 | Welland |
| 6,150,891 A | | 11/2000 | Welland et al. |
| 6,157,198 A | | 12/2000 | Mauerman |
| 6,175,280 B1 | | 1/2001 | Lloyd et al. |
| 6,175,282 B1 | | 1/2001 | Yasuda |
| 6,211,747 B1 | | 4/2001 | Trichet et al. |
| 6,316,991 B1 | | 11/2001 | Muyshondt et al. |
| 6,406,806 B1 | | 6/2002 | Keskula et al. |
| 6,473,607 B1 | | 10/2002 | Shohara et al. |
| 6,486,745 B1 | | 11/2002 | Manlove et al. |
| 6,542,044 B1 | | 4/2003 | Berquist et al. |
| 6,545,547 B2 | | 4/2003 | Fridi et al. |
| 6,549,078 B1 | | 4/2003 | Sridharan et al. |
| 6,816,716 B2 | | 11/2004 | Shohara |
| 6,850,125 B2 | | 2/2005 | Norman et al. |
| 6,933,788 B2 | | 8/2005 | Forrester |
| 7,546,097 B2 | * | 6/2009 | Dunworth et al. ............ 455/124 |
| 2001/0020875 A1 | | 9/2001 | Jansson |
| 2002/0036545 A1 | | 3/2002 | Fridi et al. |
| 2002/0079973 A1 | | 6/2002 | Higashi et al. |
| 2002/0118074 A1 | | 8/2002 | Jovenin |
| 2002/0177425 A1 | | 11/2002 | Li |
| 2002/0186440 A1 | | 12/2002 | Adachi et al. |
| 2003/0030497 A1 | | 2/2003 | Duncan et al. |
| 2003/0050029 A1 | | 3/2003 | Kaufmann et al. |
| 2003/0119467 A1 | | 6/2003 | Welland et al. |
| 2003/0171105 A1 | | 9/2003 | DunWorth et al. |

FOREIGN PATENT DOCUMENTS

| | | |
|---|---|---|
| EP | 0735693 | 10/1996 |
| EP | 1168627 | 5/2005 |
| JP | 5268078 | 10/1993 |
| JP | 2001230667 | 8/2001 |
| WO | 9904495 | 1/1999 |

OTHER PUBLICATIONS

Wilson, et al., "A CMOS Self-Calibrating Frequency Synthesizer", IEEE Journal of Solid-State Circuits, vol. 35, No. 10, Oct. 2000, pp. 1437-1444.

"Design of an Integrated CMOS PLL Frequency Synthesizer" IEEE. A Low-Noise Multiple Output Phase Locked Loop Synthesizer for Radar Applications European Frequency and Time Forum (2002).

Bellaouar, Abdellatif, et al. "A Highly-Integrated SiGe BiCMOS WCDMA Transmitter IC"; ISSCC 2002/Session 14/Cellular RF Wireless.

International Search Report, PCT/US03/006955, International Search Authority, European Patent Office Dec. 3, 2003.

\* cited by examiner

"Too Fast"

"Too Slow"

"Just Right"

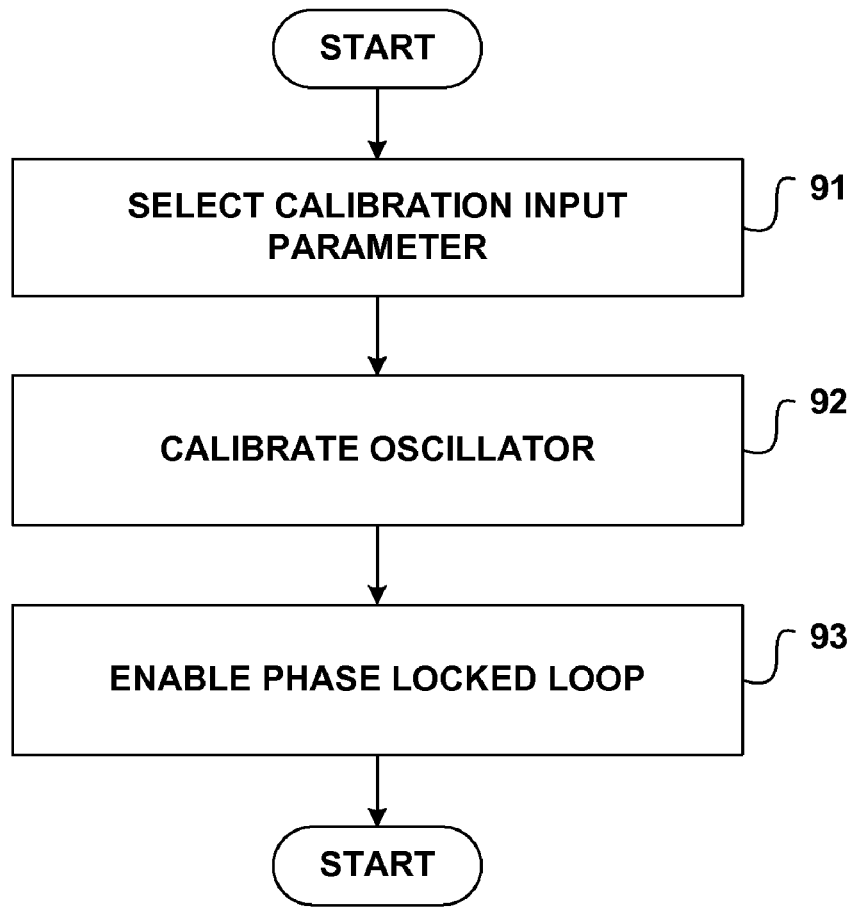

CALIBRATION TECHNIQUES FOR FREQUENCY SYNTHESIZERS

RELATED APPLICATIONS

The present application for patent is a divisional of U.S. patent application Ser. No. 10/092,669 entitled "CALIBRATION TECHNIQUES FOR FREQUENCY SYNTHESIZERS" filed Mar. 6, 2002, which is hereby expressly incorporated by reference in its entirety.

FIELD

This disclosure relates to frequency synthesizers, and more particularly to frequency synthesizers that can be flexibly implemented.

BACKGROUND

Frequency synthesizers are commonly implemented within wireless communication devices that transmit and receive encoded radio frequency (RF) signals. A number of different wireless communication techniques have been developed including frequency division multiple access (FDMA), time division multiple access (TDMA) and various spread spectrum techniques. One common spread spectrum technique used in wireless communication is code division multiple access (CDMA) signal modulation in which multiple communications are simultaneously transmitted over a spread spectrum radio-frequency (RF) signal. Some example wireless communication devices that have incorporated one or more wireless communication techniques include cellular radiotelephones, PCMCIA cards incorporated within portable computers, personal digital assistants (PDAs) equipped with wireless communication capabilities, and the like.

Frequency synthesizers of wireless communication devices may be used during both RF signal reception and RF signal transmission. For example, during RF signal reception of CDMA encoded signals, RF signals are typically mixed down to baseband signals, which can be converted to digital values. During the mixing down process, reference waveforms are produced by a frequency synthesizer that utilizes a local clock of the wireless communication device as a timing reference. After mixing the RF signal down to baseband, the baseband signals are typically passed through an analog-to-digital (A/D) converter to produce the digital values that can be tracked and demodulated. For example, a RAKE receiver can be used to track and demodulate multi-path signals of a CDMA system. A number of different CDMA architectures have been developed, such as for example, a heterodyne architecture that includes both an intermediate frequency (IF) section and an RF section, and a Zero IF architecture which converts incoming RF signals directly into baseband signals without first converting the RF signals to IF signals. Depending on the architecture, any number of frequency synthesizers may be implemented to provide reference waveforms to the mixers.

Frequency synthesizers are also used during RF signal transmission. In that case, baseband signals are up-mixed to RF. During the up-mixing process, the frequency synthesizer produces carrier RF waveforms. The carrier waveforms are then encoded with the baseband signal before being wirelessly transmitted. Again, the frequency synthesizer typically uses the local clock of the wireless communication device as the timing reference. For example, the carrier RF waveform may be created by a voltage controlled oscillator (VCO) whose frequency is determined by a phase locked loop (PLL).

The timing reference for the PLL is a high precision low frequency crystal oscillator, such as a voltage controlled temperature compensated crystal oscillator (VCTCXO). The VCO may be off-chip, or alternatively integrated on-chip. The phase locked loop (PLL) that provides closed-loop analog control of the oscillator can either be integrated on the same chip as the VCO, or can likewise be a separate off-chip component.

Frequency variation of the VCO is a major concern. Frequency variation can be caused by one or more of a number of factors, including manufacturing variations, process variations, and frequency variations caused by changes in ambient conditions such as temperature. The analog voltage applied at the VCO can be modified to account for frequency errors, but the analog gain of the VCO is limited. Moreover, it is often desirable to reduce the gain of the VCO in order to limit the amount of noise introduced into the system. Frequency variation can be particularly problematic in integrated frequency synthesizers that integrate the VCO on-chip with the phase locked loop. In particular, varactors of an on-chip VCO may present more variation in mean capacitance than the VCO is able to compensate in voltage controlled capacitance.

SUMMARY

In one embodiment, a frequency synthesizer comprises an oscillator and a calibration unit. The oscillator may be a voltage controlled oscillator (VCO) that includes configurable circuitry that can be selectively activated to adjust the frequency of the oscillator for a given input voltage. For example, the configurable circuitry may comprise a set of switched capacitors. The calibration unit of the frequency synthesizer may selectively activate the configurable circuitry of the VCO based on a comparison of a signal indicative of the oscillating frequency of the VCO and a signal indicative of a reference frequency. More specifically, the calibration unit may initialize dividers that provide the signals indicative of the VCO frequency and the reference frequency at approximately the same time, so that the frequencies of the generated signals are substantially in phase at the start of calibration. In this manner, the frequency synthesizer can be quickly calibrated, ensuring that an analog gain of the frequency synthesizer is adequate to tune the VCO.

The various embodiments and techniques described in detail below may be implemented in hardware, software, firmware, or any combination thereof. Additional details of these and other embodiments are set forth in the accompanying drawings and the description below. Other features, objects and advantages will become apparent from the description and drawings, and from the claims.

BRIEF DESCRIPTION OF DRAWINGS

FIG. 9 is another flow chart according to an additional embodiment.

DETAILED DESCRIPTION

In general, this disclosure is directed to a frequency synthesizer for use in a wireless communication device, or similar device that requires precision frequency synthesis but small amounts of noise. In particular, the frequency synthesizer may implement a phase locked loop (PLL) to provide analog tuning control of an integrated oscillator such as an integrated voltage controlled oscillator (VCO).

In addition, the frequency synthesizer may implement open-loop discrete calibration prior to implementing the analog tuning control. In particular, the frequency synthesizer may implement the discrete calibration techniques as outlined in greater detail below in order to quickly and precisely calibrate the VCO prior to implementing analog control via a phase locked loop (PLL). In this manner, the analog gain of the VCO can be significantly reduced, which can improve performance of the wireless communication device by reducing noise associated with large gain values.

In one embodiment, a frequency synthesizer includes a voltage controlled oscillator (VCO) integrated with a phase locked loop (PLL). The frequency synthesizer may invoke a calibration routine in order to calibrate the VCO. For example, a calibration unit may compare the frequency of the VCO at a defined reference voltage with a known reference frequency. The calibration unit can then adjust the initial capacitance of the VCO in order to ensure that the VCO is calibrated to be within the tuning range of the PLL. More specifically, during calibration, the calibration unit may initialize frequency dividers that provide measures of the VCO frequency and reference frequency.

As outlined in greater detail below, by initializing the frequency dividers at approximately the same time, substantial phase error between the signals indicative of the VCO frequency and the reference frequency can be avoided. Moreover, by avoiding substantial phase error between the signals indicative of the VCO frequency and the reference frequency, calibration can be completed more quickly and more accurately.

Figure 1:
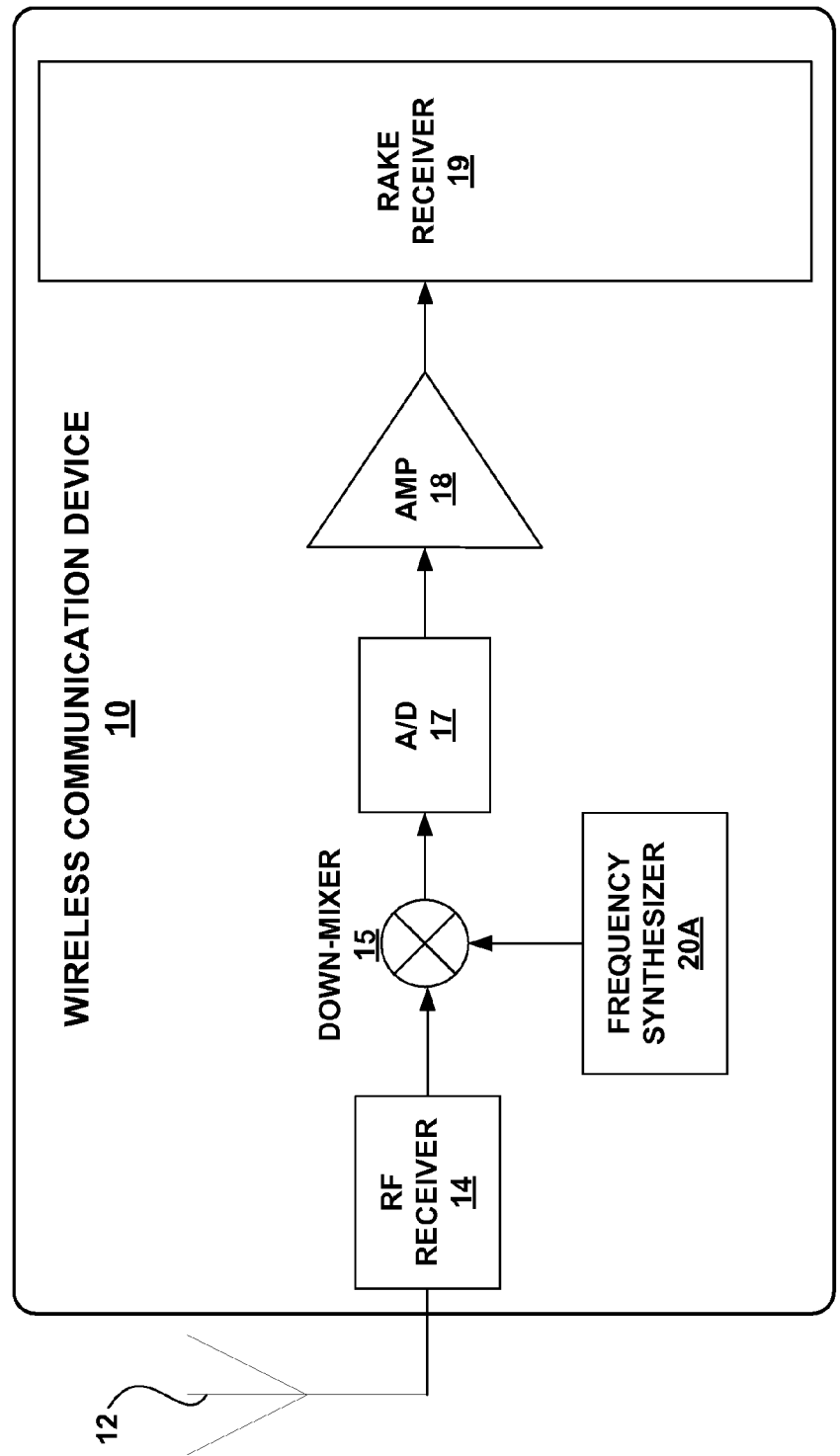
FIG. 1 is a block diagram of a wireless communication device implementing a frequency synthesizer for RF signal reception.
Figure 2:
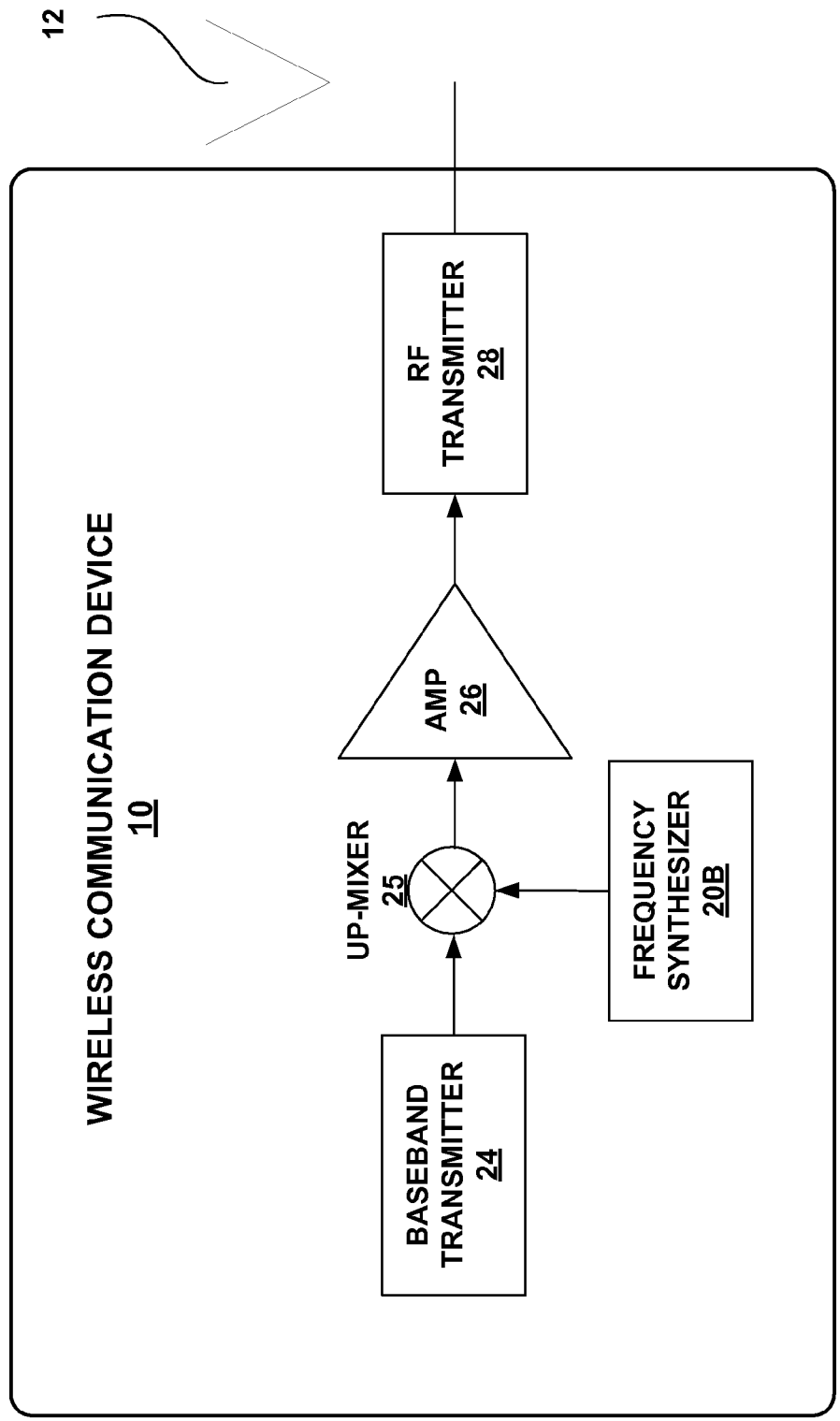
FIG. 2 is a block diagram of a wireless communication device implementing a frequency synthesizer for RF signal transmission.

FIGS. 1 and 2 are block diagrams of a wireless communication device 10 implementing frequency synthesizers 20A and 20B during RF signal reception and RF signal transmission respectively. In either case, frequency synthesizer 20 may implement one or more of the techniques outlined below to improve operation of the wireless communication device 10.

In particular, FIG. 1 is a block diagram of an exemplary wireless communication device (WCD) 10 implementing the Zero IF architecture, although this disclosure is not limited in that respect. In that case, WCD 10 converts incoming RF signals directly into baseband signals and, specifically, does not first convert the RF signals to intermediate frequency (IF) signals. It is understood, however, that the techniques described herein may be readily applicable to any architecture that implements one or more frequency synthesizers.

WCD 10 includes antenna 12 that receives incoming RF signals. For example, the incoming RF signals may comprise code division multiple access (CDMA) modulated signals sent from a CDMA base station. An RF signal received by antenna 12 can be processed by RF receiver 14, such as by passing the signal through low-noise amplifier (LNA) and one or more filters. The RF signal is then mixed down to baseband by down-mixer 15. In particular, down-mixer 15 may receive reference waveforms produced by frequency synthesizer 20A. Frequency synthesizer 20A may implement a calibration routine as outlined in greater detail below to calibrate frequency synthesizer to approximately the correct operative frequency. The calibration routine may improve the frequency synthesis process, reduce noise in the system, and allow for simplification of various components of frequency synthesizer 20A.

Down mixer 15 produces baseband signals which can be filtered and sampled by analog to digital (A/D) converter 17 to produce corresponding digital values of the signals. One or more amplifiers 18, such as a digital voltage gain amplifier (VGA), can be used to scale the digital baseband signal, either by amplifying or attenuating the digital values according to gain values received from an automatic gain control unit (not shown).

After scaling by amplifier 18, the scaled digital baseband signal is provided to RAKE receiver 19, which separates and tracks signals received from different sources, e.g., different base stations, or signals received from the same source via multiple propagation paths, i.e. multi-path signals. For example, RAKE receiver 19 may include a number of "fingers" that perform despreading, Walsh decovering and accumulation, pilot time tracking and frequency tracking. Each finger of RAKE receiver 19 outputs pilot and data symbols for the corresponding path. Symbol demodulation and/or other signal processing may then be performed on the pilot and data symbols. As desired, WCD 10 may also include additional components (not shown) such as filters and various digital or analog signal processing components.

FIG. 2 is another block diagram of WCD 10, illustrating components implemented during RF signal transmission. In that case, baseband transmitter 24 may generate and forward baseband signals to up-mixer 25. Frequency synthesizer 20B provides carrier RF waveforms to up-mixer 25. Frequency synthesizer 20B may be the same synthesizer as frequency synthesizer 20A (FIG. 1), or may be a different synthesizer than that used for signal reception. In either case, frequency synthesizer 20B implements calibration techniques as outlined below to calibrate itself to generate oscillating signals at the correct operative frequency. Up-mixer 25 modulates the baseband signal into the RF carrier and forwards the modulated RF signal to amplifiers 26 for scaling. Amplifiers 26 may include one or more voltage gain amplifiers (VGAs), driver amplifiers (DAs), and power amplifiers (PAs). The different amplifiers may reside on the same integrated circuit chip, or multiple different chips. Once the modulated RF signal has been adequately amplified or attenuated, RF transmitter 28 may transmit the modulated RF signal from wireless communication device 10 via antenna 12.

Figure 3:
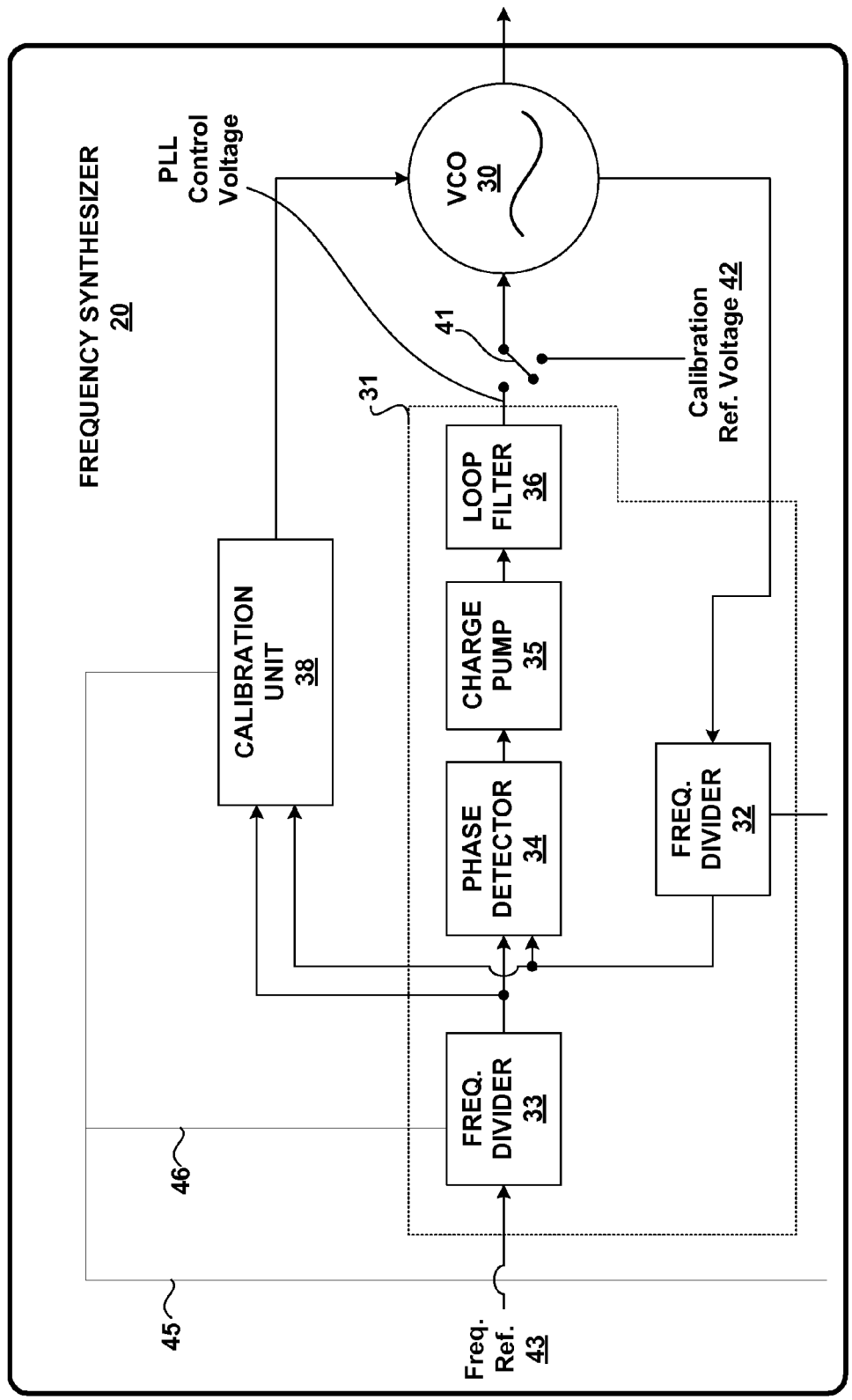
FIG. 3 is a more detailed block diagram of an exemplary frequency synthesizer according to an embodiment.

FIG. 3 is a more detailed block diagram of frequency synthesizer 20 according to an embodiment. Frequency synthesizer 20 may correspond, for example, to either frequency synthesizer 20A or 20B illustrated in FIGS. 1 and 2 respectively. Frequency synthesizer 20 may comprise an oscillator such as a voltage controlled oscillator (VCO) 30 integrated with a phase locked loop (PLL) 31. For example, PLL 31 may provide analog closed-loop control of the VCO 30 via an input control voltage. PLL 31 may include a number of components, including frequency dividers 32 and 33, a phase detector 34, a charge pump 35 and a loop filter 36. For example, frequency dividers 32 and 33 can respectively scale a reference frequency (such as provided by a temperature compensated crystal oscillator (TCXO)), and the VCO frequency, so that phase detector 34 can determine the frequency difference between the two frequencies. Charge pump 35 can then adjust the input voltage to VCO 30 as needed, to either increase or decrease the oscillator frequency. Loop filter 36 may perform filtering of the input signals to VCO 30 in order to improve performance of frequency synthesizer 20 and possibly reduce noise in the system.

The analog gain of the PLL 31, however, is limited. In other words, charge pump 35 is capable of producing input voltages to VCO 30 within a finite range of voltages. Moreover, larger gains generally result in increased system noise provided by frequency synthesizer 20. Accordingly, it is generally desirable to reduce the range of gain that charge pump 35 provides to oscillator 30.

To compound the problems raised by large gains in PLL 31, VCO 30 may have relatively large frequency variations, caused by factors such as manufacturing variations, process variations, and frequency variations caused by changes in ambient conditions. The analog voltage applied by charge pump 34 to VCO 30 can be modified to account for these frequency errors but, as mentioned, the analog gain of the VCO is limited. Frequency variation in VCO 30 is particularly problematic in integrated frequency synthesizers that integrate VCO 30 on-chip with the PLL 31, because varactors of an on-chip VCO may vary by more in mean capacitance than the VCO can compensate in voltage controlled capacitance.

For these and other reasons, frequency synthesizer 20 includes a calibration unit 38 to calibrate VCO 30 prior to activating the analog closed-loop voltage control of VCO 30. For example, calibration unit 38 can calibrate VCO 30 to operate at or near an optimal frequency for a defined voltage corresponding to, for example, a center of the available voltages that charge pump 35 can generate. In this manner, the required gain of PLL 31 can be reduced, which can improve performance of WCD 10 (FIGS. 1 and 2) by reducing noise introduced by frequency synthesizer 20.

VCO 30 may be configurable so that calibration can be performed prior to closed-loop analog control. For example, VCO 30 may include a number of switched capacitors. Calibration unit 38 may selectively activate a number of the switched capacitors of VCO 30 in order to properly calibrate VCO 30 to an optimal or near optimal operating frequency. Once calibrated VCO 30 may be controlled via PLL 31.

Frequency synthesizer 20 may include a calibration switch 41 for placing frequency synthesizer 20 in either a calibration state or a normal operation state. For example, during calibration, switch 41 can select "calibration reference voltage" 42 as input to oscillator 30. Calibration reference voltage 42 may be provided by an operational amplifier (op amp) and can be chosen to correspond to the center of the available input voltages that charge pump 35 can provide. Calibration reference voltage 42 may be tested or checked during calibration in order to ensure that it is the desired reference voltage.

Additionally, in some cases, calibration reference voltage 42 can be skewed in order to compensate for ambient conditions such as temperature. For example, if the ambient temperature is less than the normal operating temperature, it may be desirable to skew calibration reference voltage 42 to the lower end of the range of voltages that charge pump 35 can provide. Similarly, if ambient temperature is greater than the normal operating temperature, it may be desirable to skew calibration reference voltage 42 to the upper end of the range of voltages that charge pump 35 can provide. For example, a temperature compensation algorithm which generates voltages proportional to absolute temperature (PTAT) may be implemented within the circuitry that generates reference voltage 42. In this manner, during normal operation, the likelihood that the PLL control voltage will attempt to go outside the range that the charge pump can provide can be reduced. In any case, calibration reference voltage 42 causes VCO 30 to oscillate at an initial frequency.

First frequency divider 32 scales the oscillator frequency, such as by dividing the frequency by an integer. Similarly, second frequency divider 33 scales a reference frequency 43, such as by dividing the reference frequency by an integer. The reference frequency 43, may be provided, for example, by a higher accuracy, lower frequency clock than VCO 30, such as a temperature compensated crystal oscillator (TCXO). The outputs of the frequency dividers 32, 33, respectively, comprise a signal indicative of the oscillator frequency (in this case, the frequency of VCO 30), and a signal indicative of the reference frequency 43. The output signals of frequency dividers 32, 33 are scaled so that a measure of the phase difference between the signals can provide a measure of the error in VCO 30.

Dividers 32 and 33 may be implemented using a wide variety of different hardware configurations, including multiplier circuits, divider circuits, shift registers, counters, and the like. In one relatively simple configuration, dividers 32, 33 include counters that count the leading or trailing edges of oscillator pulses, and provide a signal each time an integer number of pulses is detected. In this manner, signals indicative of the frequency of VCO 30 and the reference frequency 43 can be generated and provided to calibration unit 38, which can use the signals to calibrate VCO 30.

In order to greatly improve the calibration process, calibration unit 38 initializes dividers 32, 33 at approximately the same time (as illustrated by control signals 45 and 46). In this manner, signals indicative of the frequency of VCO 30 and the reference frequency 43 are scaled at approximately the same time. In other words, by initializing dividers 32, 33 at approximately the same time, the signals generated by dividers 32, 33 are substantially in phase. Therefore, calibration unit 38 can determine a frequency difference between the signals generated by dividers 32, 33 after only one signal cycle. In this manner, calibration unit 38 can avoid the need to accumulate or track the generated signals for extended periods of time in order to determine the frequency difference. Instead, by initializing dividers 32, 33 at approximately the same time, calibration unit 38 can determine the frequency difference between the signals and adjust VCO 30 more quickly. In other words, initializing dividers 32, 33 at approximately the same time can significantly reduce the time it takes to calibrate VCO 30.

Figure 4:
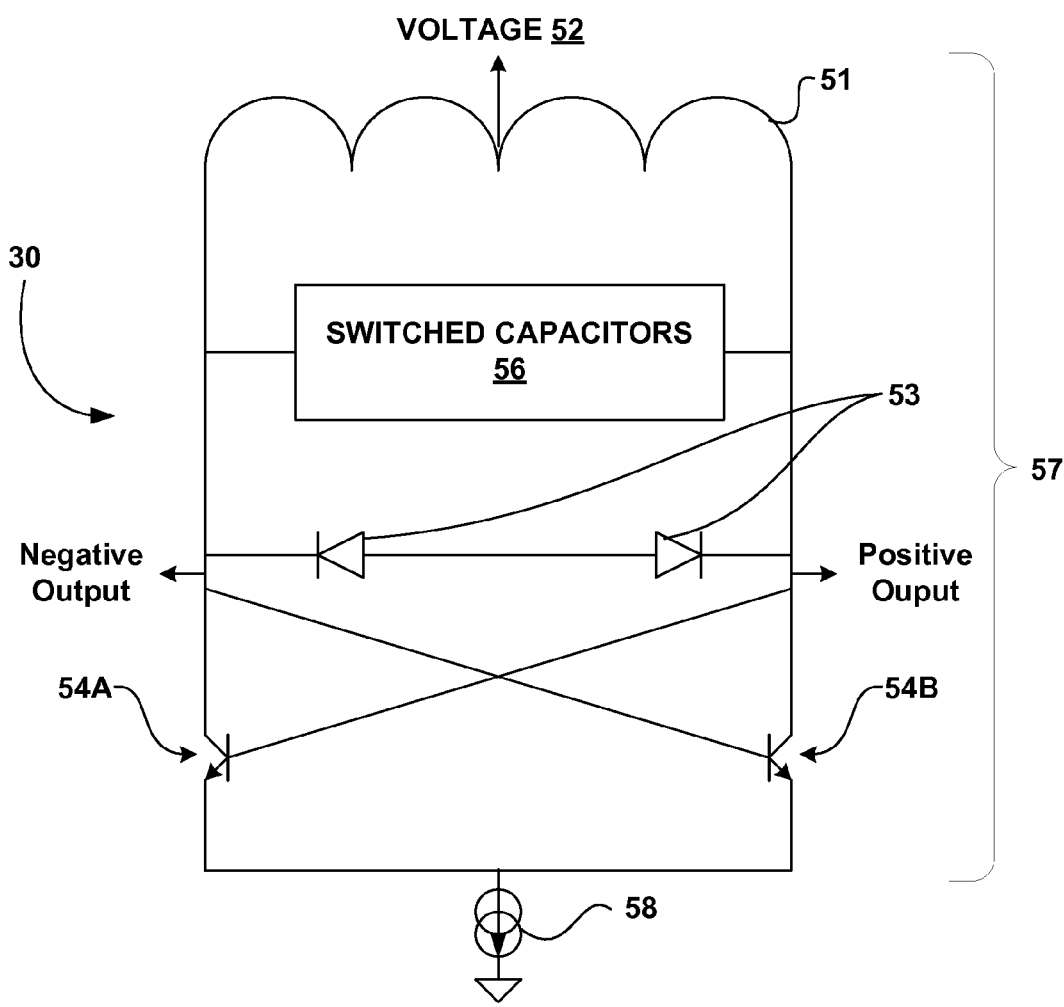
FIG. 4 is circuit diagram of an exemplary voltage controlled oscillator including configurable circuitry in the form of switched capacitors.

FIG. 4 is a circuit diagram illustrating an exemplary VCO 30. Although various embodiments are described specifically with reference to a VCO, this disclosure is not necessarily limited in that respect. Other embodiments implementing various different oscillators within a frequency synthesizer, such as current controlled oscillators, and the like, may also implement similar techniques to those specifically described herein.

As shown in FIG. 4, VCO 30 comprises an oscillator tank 57 coupled to a tail current source 58. The oscillator tank 57 of VCO 30 may comprise an LC circuit (inductor-capacitor circuit) that includes inductor 51 tapped by a voltage source 52. The oscillator tank 57 of VCO 30 may also include one or more varactors 53, as well as transistors 54A and 54B. For example, varactors 53 may comprise reverse biased diodes that together behave like a capacitor. In addition, the oscillator tank 57 of VCO 30 includes configurable circuitry in the form of an array of switched capacitors 56. The switched capacitors 56 can be selectively activated during the calibration process in order to calibrate VCO 30 to an acceptable operating frequency.

Figure 5:
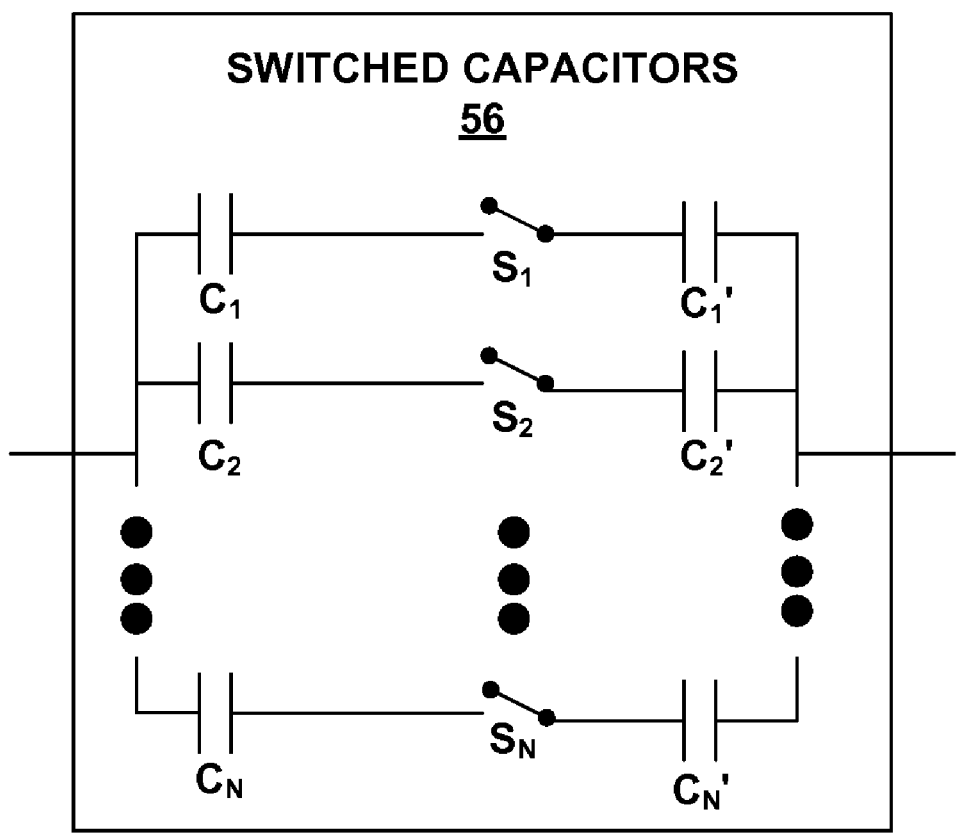
FIG. 5 is a more detailed circuit diagram of a set of switched capacitors in parallel that can be selectively activated to calibrate a voltage controlled oscillator.

FIG. 5 is a more detailed circuit diagram of an exemplary array of switched capacitors 56. In general, the array of switched capacitors 56 may include a number (N) of capacitors in parallel, although other configurations could also be used. In the illustrated example, each switch ($S_1$-$S_N$) can be used to activate two capacitors in series. In other words, each switched capacitor comprises an activation switch (S) and capacitors (C and C') in series. In the embodiment of FIG. 5, as more switches are activated, more capacitors are added to the circuit, and the total capacitance of the circuit increases. Accordingly, calibration unit 38 can calibrate VCO 30 by selectively activating or deactivating the number of switches sufficient to compensate for measured frequency differences between the signal indicative of the oscillator frequency and the signal indicative of the reference frequency. It is understood that FIG. 5 is merely an exemplary configuration of switched capacitors, and that alternative configurations will become readily apparent in light of this disclosure.

Figure 6:
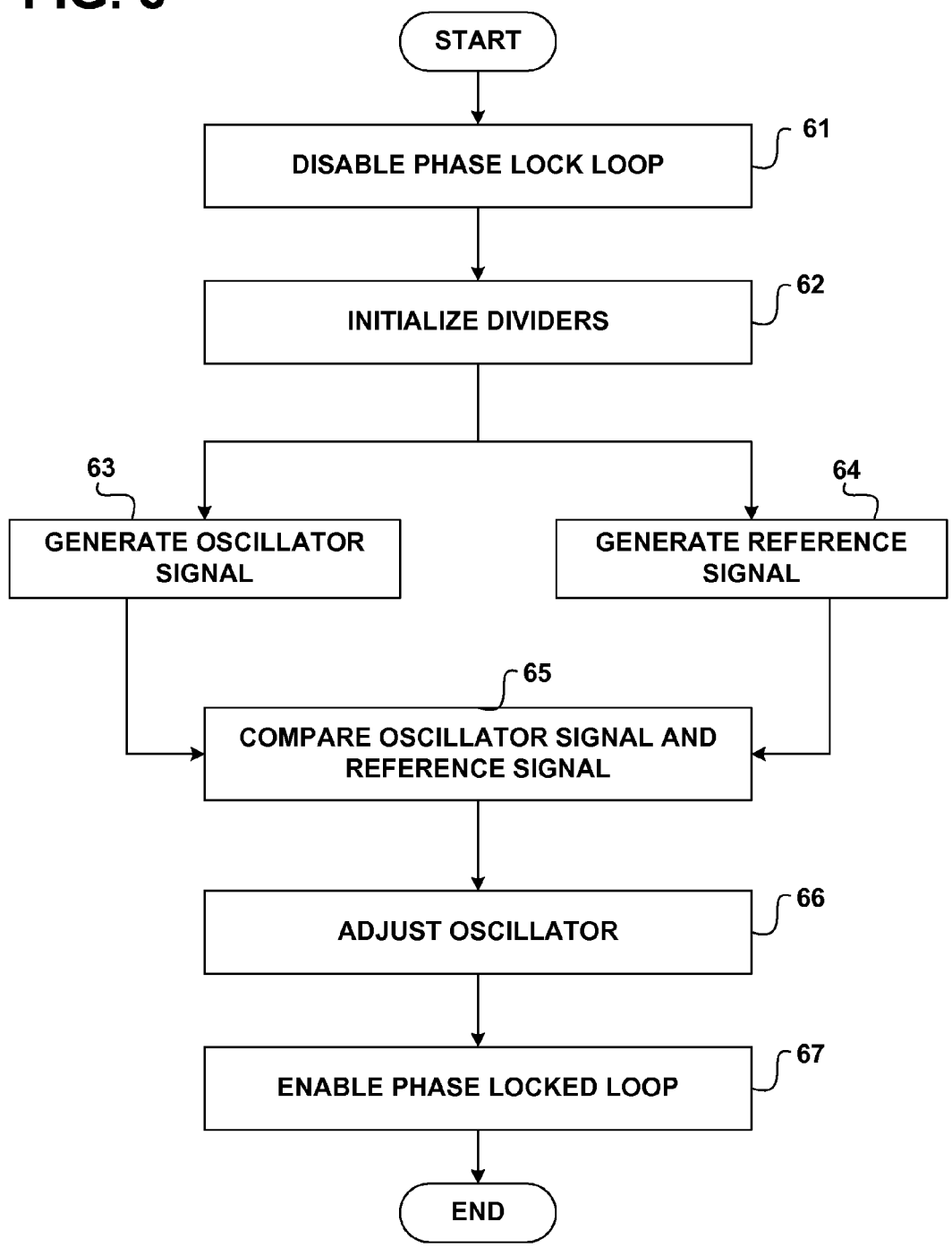
FIG. 6 is a flow diagram according to an embodiment, illustrating a calibration technique for a frequency synthesizer.

FIG. 6 is a flow diagram illustrating a calibration technique for a frequency synthesizer. In particular, the technique illustrated in FIG. 6 may be implemented as an open calibration loop for calibrating VCO 30 prior to activating the analog closed-loop control. As shown, calibration unit 38 disables the phase locked loop (PLL) 31 (61), such as by activating switch 41 to provide calibration reference voltage 42 as input to VCO 30. At that point, calibration unit 38 may wait for a short period of time, as needed, in order to ensure that the initial oscillation frequency of VCO 30 reaches steady state. In other words, it may be desirable to allow the various components of frequency synthesizer 20 to warm up for a short time following the input of calibration reference voltage 42 to VCO 30.

Once the system has warmed up, calibration unit 38 initializes frequency dividers 32 and 33 (62), such as by sending one or more control signals 45, 46. In particular, calibration unit 38 may initialize frequency dividers 32, 33 at approximately the same time. In one embodiment, frequency dividers 32, 33 comprise counters that count the leading or trailing edges of oscillator pulses. In that case, dividers 32, 33 are initialized by starting the counters at approximately the same time. First frequency divider 32 generates an oscillator signal (63), i.e., a signal indicative of the initial frequency of VCO 30. Similarly, second frequency divider 33 generates a reference signal (64), i.e., a signal indicative of the reference frequency 43. In this manner, dividers 32, 33 can generate in-phase signals indicative of the initial frequency of VCO 30 and the reference frequency 43. Dividers 32, 33 may respectively scale the respective input frequencies so that the generated signals are normalized with respect to one another.

Calibration unit 38 compares the oscillator signal and the reference signal (65) in order to determine whether VCO 30 is oscillating at an acceptable frequency. Specifically, calibration unit 38 can measure the time difference between the leading edges of signals generated by dividers 32 and 33 to determine the frequency difference between the two signals. Calibration unit 38 may include comparison circuitry for this purpose. In this manner, calibration unit can determine whether VCO 30 is oscillating at an acceptable frequency.

Calibration unit 38 can then adjust VCO 30 accordingly (66). For example, calibration unit 38 may include a digital state machine for controlling configurable circuitry of VCO 30. As illustrated in FIGS. 4 and 5, the configurable circuitry of VCO 30 may comprise a set of switched capacitors 56. Accordingly, calibration unit 38 may selectively activate or deactivate one or more of the switches in order to properly calibrate VCO 30 to operate at or near an optimal oscillation frequency. In some cases, a subset of switches can be simultaneously activated or deactivated, and in other cases, the activation of the switches can be incremented over the course of the calibration routine. In any case, once VCO 30 is properly adjusted (66), PLL 31 can be enabled (67), such as by activating switch 41 to provide the output of the PLL as the voltage control input to VCO 30. In this manner, analog control of VCO 30 is enabled after discrete calibration.

The calibration routine may be repeated periodically, if needed. In particular, the PLL control voltage (labeled but not numbered in FIG. 3) which is used as voltage control input to VCO 30 during normal operation may be tested or checked during the normal operation to determine if calibration should be repeated at the next available opportunity. A condition that indicates calibration should be repeated may correspond to the condition where the PLL control voltage is outside the range of voltages that the charge pump can provide without degrading performance of the charge pump. This range of voltages may incorporate a small safety range, so that the PLL control voltage is checked against voltages that are a small amount within the range of the voltages that the charge pump can provide.

Figure 7:
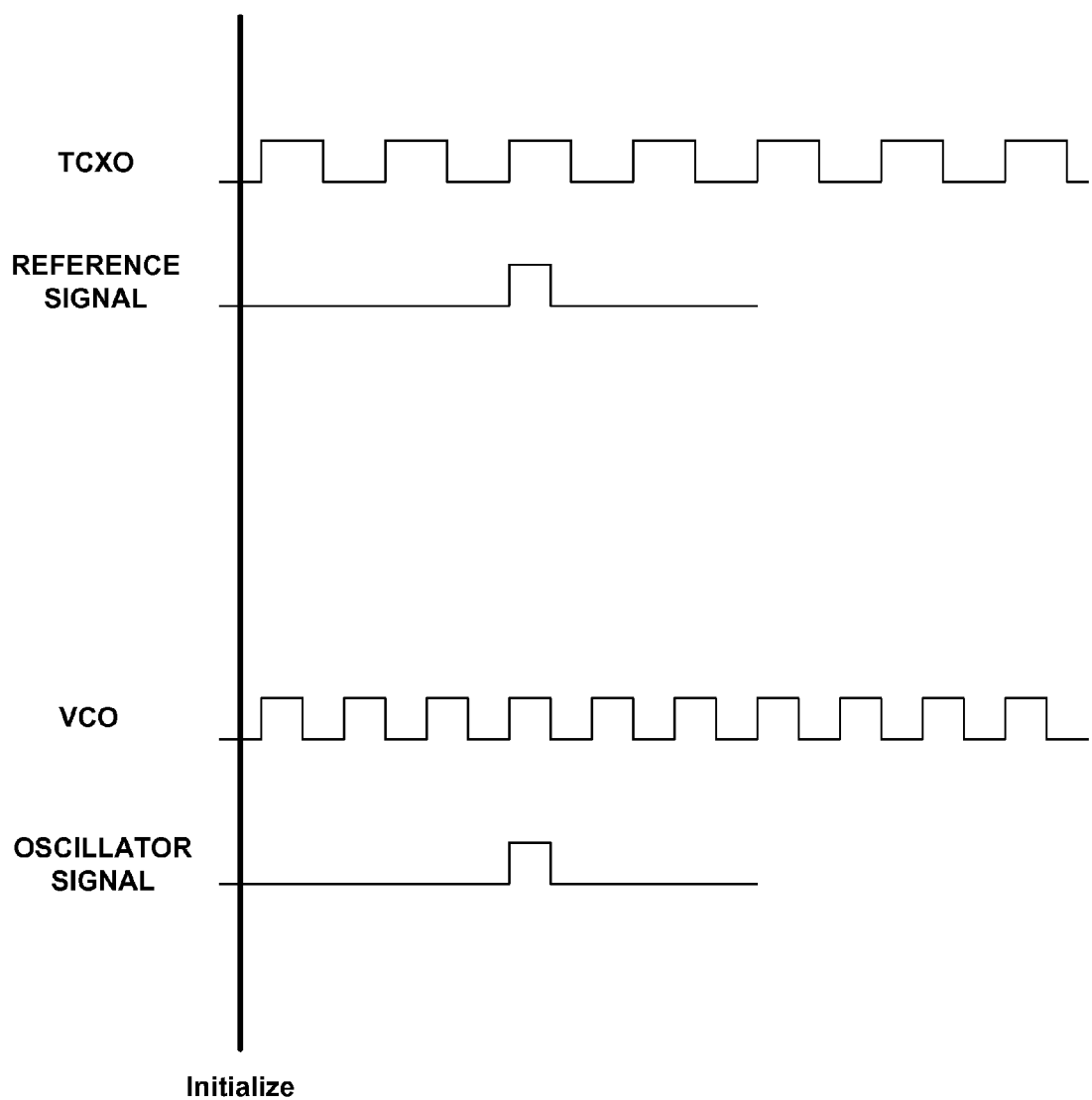
FIG. 7 is a timing diagram illustrating the generation of signals indicative of a reference frequency and an oscillator frequency.

FIG. 7 is a timing diagram illustrating the timing of the generation of the oscillator signal and reference signal by dividers 32 and 33. As illustrated, at time=initialize, counters within dividers 32 and 33 are reset at the same time. The counters within dividers 32 and 33 respectively count the leading edges of pulses of the respective signal, and respectively generate a reference signal pulse and an oscillator signal pulse after a defined number of pulses have respectively been counted. For example, as illustrated, the reference frequency provided by TCXO may be divided by three. In that case, divider 33 counts leading edges of TCXO pulses and generates a reference signal pulse after three counts. Similarly, the oscillator frequency provided by VCO may be divided by four. In that case, divider 32, counts leading edges of VCO pulses and generates an oscillator signal after four pulses. The oscillator signal and reference signal can then be compared in order to identify a phase difference to identify whether the frequency of VCO 30 is too fast, too slow, or within an acceptable frequency range. FIG. 7 is simplified for illustrative purposes. In operation, the frequency of TCXO is typically much smaller than the frequency of the VCO. Accordingly, divider 33 would typically count a much smaller integer number of pulses than divider 32 before generating the respective signal.

The integers used to define the number of pulses counted by dividers 32 and 33 can be defined so that the generated reference signal and oscillator signal are approximately normalized. Moreover, because the signals are in phase, the frequency difference between the two generated signals can be determined very quickly. Specifically, the frequency difference between the two generated signals can be determined after only one signal cycle. In this manner, the need for accumulators or more complex comparative circuitry can be avoided. Moreover, because the signals are generated in phase, the calibration time can be significantly reduced.

Figure 8A:
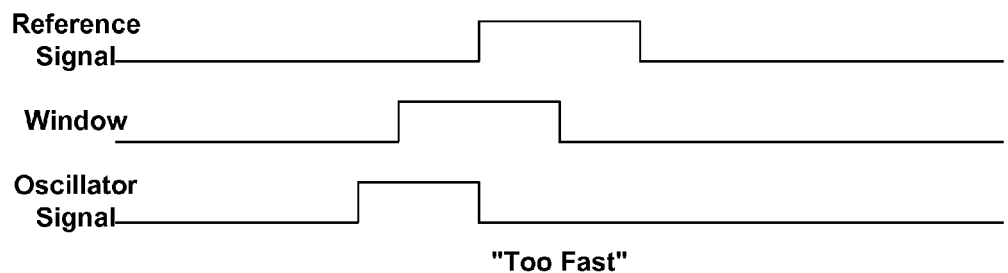
FIGS. 8A-8C are timing diagrams illustrating the comparison of a signal indicative of an oscillator frequency and a signal indicative of a reference frequency.
Figure 8B:
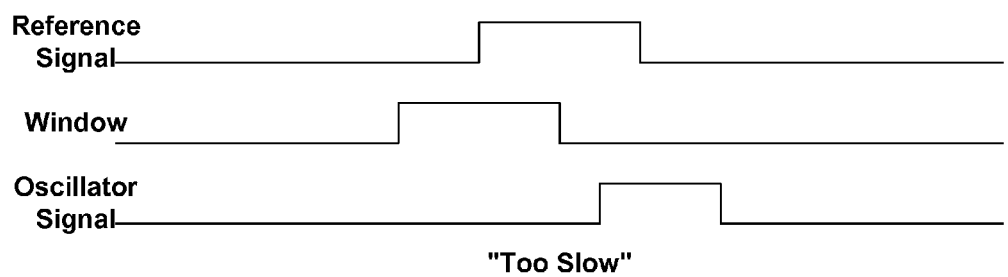
Figure 8C:
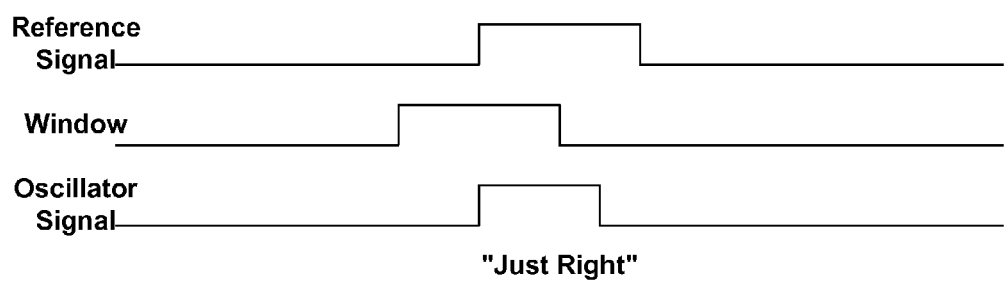

FIGS. 8A-8C are additional timing diagrams illustrating one example of the how calibration unit 38 can compare the oscillator signal and reference signal. In this case, calibration unit 38 may examine the oscillator signal and reference signal to determine whether oscillation frequency of VCO is acceptable. The reference signal provides a reference for examining the oscillator signal. The reference divider 33 may also define an acceptable window around the leading edge of the pulse of the reference signal. If the leading edge of the oscillator signal falls within the window, it is acceptable. If not, VCO 30 can be adjusted. The size of the window can be chosen according to the desired precision of the calibration routine.

In FIG. 8A, the leading edge of the oscillator signal comes before the window. In that case, VCO 30 is operating at a frequency that is too high (or "too fast"). Accordingly, in that case, calibration unit 38 can activate capacitor switches to reduce the frequency of VCO 30. As shown in FIG. 8B, the leading edge of the oscillator signal comes after the window. In that case, VCO is operating at a frequency that is too low (or "too slow"). Accordingly, in that case, calibration unit 38 can deactivate capacitor switches to increase the frequency of VCO 30. As shown in FIG. 8C, the leading edge of the oscillator signal falls within the window. In that case, VCO is operating at a frequency that is acceptable. Accordingly, in that case, calibration unit 38 does not need to activate or deactivate capacitor switches of VCO. FIG. 8C is captioned "just right" because the leading edge of the oscillator signal is precisely aligned within the window of the reference signal.

The described embodiments are capable of providing a number of advantages. Specifically, performing discrete calibration of VCO 30 prior to invoking PLL 31 for analog control can reduce noise in the system by reducing the necessary gain of PLL 31. Moreover, reducing the needed gain of the PLL can allow simplification of components of charge pump 35, and possibly a more aggressive design of loop filter 36, to even further reduce noise.

Furthermore, initializing frequency dividers 33, 34 at approximately the same time can significantly reduce the amount of time needed for calibration, by providing signals to calibration unit 38 that are in phase. When the signals are in phase, comparison of the signals can be greatly simplified. Moreover, this advantage can carry over to actually improve performance of PLL 31 following calibration. For example, phase detector 34 of PLL 31 may also be able to more quickly detect the phase difference between the signals because of the simultaneous initialization of dividers 32 and 33. In other words, the lock time of the PLL 31 can be reduced.

In some embodiments, calibration unit 38 re-initializes dividers 32 and 33 after the calibration routine. In other words, calibration unit 38 re-initializes dividers 32 and 33 when switch 41 is activated to enable PLL 31. This additional initialization can even further reduce the lock time of the PLL 31, specifically because the signals provided from dividers 32 and 33 to phase detector 34 are in phase at the beginning of operation of PLL 31. Additionally, the locking times of the PLL may be further improved by the fact that the PLL starts with both insignificant phase error and very small frequency error due to the calibration.

Another advantage of the embodiments described herein is that the same dividers 32 and 33 can be used for the discrete calibration loop and the analog control loop of PLL 31. In both cases, dividers 32 and 33 can be initialized at the same time so that generated signals are in phase. By initializing dividers 32, 33 at the beginning of discrete calibration, the time it takes for calibration can be reduced, and by initializing the dividers following discrete calibration, the lock time of PLL 31 can be reduced. Moreover, by using the same dividers for both the discrete calibration loop and the analog control loop of PLL 31 the overall amount of circuitry of frequency synthesizer 20 can be reduced.

Still additional features may also be implemented to improve the performance of the PLL based on information obtained during calibration. In other words, the result of the calibration may provide information about the analog gain of the VCO. Using this information, the analog gain of the charge pump can be adjusted when the PLL is enabled, so that the total gain of the PLL is maintained relatively constant.

More specifically, after the calibration routine has determined a particular switched capacitance setting, the determined setting can be used to initialize the gain of the charge pump of the PLL. For example, the switched capacitance setting may be represented as a number, e.g. between 1 and 32. Through simulation, it can be determined that if the final setting of the frequency calibration loop is 16, then the analog gain of the VCO (Kv) will be X for a nominal frequency of the oscillator. However, if the final setting of the calibration loop is for example 17, then the analog gain of the VCO may be increased, for example, to be X+5%*X. Likewise, if the setting is 15, then the analog gain of the VCO may be decreased, for example, to be X−5%*X.

In order to keep the loop gain of the PLL relatively constant, the analog gain of the charge pump (Kφ) can be initialized based on information determined during frequency calibration, e.g., the capacitor setting or the analog gain of the VCO (Kv). Thus, if the nominal gain of the charge pump (Kφ) is Y, then in the case where the final calibration setting is 17, Kφ can be adjusted to be Y/(1+5%). Similarly, if the final setting is 15, Kφ may be adjusted to be Y/(1−5%). In general, the final calibration setting provides information about the analog gain of the VCO. This information can be used to adjust the analog gain of a different portion of the PLL (such as the gain of the charge pump) in order to keep the total analog gain constant. Since total gain is proportional to Kv*Kφ, keeping Kv*Kφ constant can likewise ensure that the total gain remains relatively constant.

As mentioned above, additional techniques can also be implemented during calibration to account for variations in ambient conditions such as temperature. For example, temperature variations may cause variations in the capacitance of varactors on an integrated on-chip VCO. For this reason, it may be desirable to skew calibration input voltage 42 in order to compensate for ambient conditions such as temperature. If temperature is not a concern, calibration input voltage may be selected to correspond the center of the available voltages that charge pump 35 can provide. However, because temperature variations can cause variations in capacitance of varactors in VCO 30, it may be desirable to adjust calibration input voltage to account for likely future changes in temperature.

For example, if the ambient temperature is less than the normal operating temperature, it may be desirable to skew calibration reference voltage 42 to the lower end of the range of voltages that charge pump 35 can provide. Similarly, if ambient temperature is greater than the normal operating temperature, it may be desirable to skew calibration reference voltage 42 to the upper end of the range of voltages that charge pump 35 can provide. A temperature compensation algorithm which generates voltages proportional to absolute temperature (PTAT) may be implemented to generate calibration reference voltage 42. For example, temperature compensation circuitry may be implemented to execute a PTAT algorithm when generating calibration reference voltage 42.

FIG. 9a another flow diagram according to an embodiment. As shown, a calibration input parameter is selected (91). For example, frequency synthesizer 20 may include temperature compensation circuitry which executes an algorithm to select a calibration reference voltage 42 proportional to absolute temperature (PTAT). VCO 30 can then be calibrated (92) as outlined above. Then, after calibration, PLL 31 can be enabled (93). By selecting the calibration input parameter according to ambient conditions, such as temperature, the likelihood that changes in ambient conditions will negatively impact operation of frequency synthesizer 20 can be reduced.

For example, if calibration is performed at a cold temperature, the analog tuning voltage will already be towards the lower end of its possible range. If the temperature increases and calibration can not be performed again, charge pump 35 will have a larger range of available voltage increases for tuning VCO 30. The range of available voltage reductions may be reduced, but significant voltage reductions would not be likely if the calibration is performed at a cold temperature.

Similarly, if calibration is performed at a hot temperature, the reference voltage starts out at the high end of the range of voltages that charge pump 35 can provide. Thus, charge pump 35 has a larger range of voltage reductions for tuning VCO 30. In that case, the range of available voltage increases may be reduced, but significant voltage increases would not be likely if the calibration is performed at a hot temperature.

A number of embodiments have been described. For example, calibration techniques have been described for discrete calibration of an oscillator prior to activating closed-loop analog control. Nevertheless various modifications can be made without departing from the scope of this disclosure. For example, the same or similar techniques may be implemented in devices other that a wireless communication device. Also, the same or similar techniques may be used with oscillators other than voltage controlled oscillators. For example, similar techniques may be may be used to calibrate current controlled oscillators, and the like.

Furthermore, although many detailed aspects of the various embodiments have been described as being implemented in hardware, the same or similar techniques may be implemented in software executing on a programmable digital signal processor (DSP), firmware, or various combinations of hardware, software and firmware. Accordingly, these and other embodiments are within the scope of the following claims.

The invention claimed is:

1. A frequency synthesizer comprising:
    an oscillator including configurable circuitry that defines an initial frequency of the oscillator for an initial input parameter;
    a first divider that generates a signal indicative of the oscillator by scaling an oscillator frequency defined by the initial input parameter;
    a second divider that generates a signal indicative of a reference by scaling a reference frequency; and
    a calibration unit coupled directly to the first and second dividers, the calibration unit being configured to adjust the configurable circuitry based on a comparison of the signal indicative of the oscillator and the signal indicative of the reference, wherein the calibration unit initializes the signals indicative of the oscillator and the reference so that the signals are substantially in phase.

2. The frequency synthesizer of claim 1, wherein the oscillator comprises a voltage controlled oscillator and the initial input parameter is an initial input voltage, and wherein the configurable circuitry comprises a number of switched capacitors, wherein the calibration unit adjusts the configurable circuitry by activating a subset of the switched capacitors based on the comparison of the signal indicative of the oscillator and the signal indicative of the reference.

3. The frequency synthesizer of claim 2, further comprising circuitry that generates the initial input voltage based on temperature.

4. The frequency synthesizer of claim 1, wherein the calibration unit initializes the first and second dividers at approximately the same time to initialize signals indicative of the oscillator and the reference so that the signals are substantially in phase.

5. The frequency synthesizer of claim 1, further comprising a phase locked loop that provides analog control of the oscillator following calibration.

6. The frequency synthesizer of claim 5, wherein the phase locked loop and the oscillator are integrated as integrated circuitry, wherein the dividers used for scaling of the reference and oscillator frequencies are also used in the phase locked loop.

7. The frequency synthesizer of claim 5, wherein the oscillator is a voltage controlled oscillator, and wherein the phase locked loop includes a charge pump that generates input voltages for the voltage controlled oscillator after calibration based on a comparison of the signal indicative of the oscillator and the frequency indicative of a reference.

8. A frequency synthesizer comprising:
    an oscillator including configurable circuitry that defines an initial frequency of the oscillator for an initial input parameter;
    a first divider means that generates a signal indicative of the oscillator by scaling an oscillator frequency defined by the initial input parameter;
    a second divider means that generates a signal indicative of a reference by scaling a reference frequency; and
    means for adjusting the configurable circuitry based on a comparison of the signal indicative of the oscillator and the signal indicative of a reference, wherein the means for adjusting initializes the signals indicative of the oscillator and the reference so that the signals are substantially in phase and is coupled directly to the first and second divider means.

9. The frequency synthesizer of claim 8, wherein the oscillator comprises a voltage controlled oscillator and the initial input parameter is an initial input voltage, and wherein the configurable circuitry comprises a number of switched capacitors, wherein the means for adjusting adjusts the configurable circuitry by activating a subset of the switched capacitors based on the comparison of the signal indicative of the oscillator and a signal indicative of the reference.

10. The frequency synthesizer of claim 9, further comprising means for generating the initial input voltage based on temperature.

11. The frequency synthesizer of claim 8, wherein the means for adjusting initializes the signals indicative of the oscillator and the reference by initializing a divider circuit for initial frequency of the oscillator and a divider circuit for the reference frequency at approximately the same time.

12. The frequency synthesizer of claim 8, further comprising means for analog control of the oscillator following calibration.

13. The frequency synthesizer of claim 12, wherein the means for analog control and the oscillator are integrated as integrated circuitry.

14. The frequency synthesizer of claim 12, wherein the oscillator is a voltage controlled oscillator, and wherein the means for analog control includes a means for generating input voltages for the voltage controlled oscillator after calibration based on a comparison of the signal indicative of the oscillator and the signal indicative of a reference.

15. A method for calibrating a frequency synthesizer comprising:
    defining an initial frequency of an oscillator for an initial input parameter;

initializing a first divider and a second divider by sending a signal from a calibration unit to each of the first and second dividers;

generating, in the first divider, a signal indicative of the oscillator by scaling an oscillator frequency defined by the initial input parameter;

generating, in the second divider, a signal indicative a reference by scaling a reference frequency;

comparing the signal indicative of the oscillator and the signal indicative of the reference in the calibration unit; and adjusting configurable circuitry connected to the oscillator based on the comparison of the signal indicative of the oscillator and the signal indicative of the reference.

16. The method of claim 15, wherein adjusting configurable circuitry comprises activating a subset of switched capacitors based on the comparison of the signal indicative of the oscillator and the signal indicative of the reference.

17. The method of claim 15, wherein the initial input parameter is an initial input voltage, the method further comprising:

generating the initial input voltage based on temperature.

18. The method of claim 15, wherein initializing the first divider and the second divider comprises initializing the signal indicative of the oscillator and the signal indicative of the reference such that the signal indicative of the oscillator and the signal indicative of the reference are substantially in phase.

19. The method of claim 18, wherein initializing the first divider and the second divider comprises initializing the signal indicative of the oscillator and the signal indicative of the reference at approximately the same time.

20. An apparatus for calibrating a frequency synthesizer comprising:

means for defining an initial frequency of an oscillator for an initial input parameter;

means for initializing a first divider and a second divider by sending a signal from a calibration unit to each of the first and second dividers;

means for generating, in the first divider, a signal indicative of the oscillator by scaling an oscillator frequency defined by the initial input parameter;

means for generating, in the second divider, a signal indicative a reference by scaling a reference frequency;

means for comparing the signal indicative of the oscillator and the signal indicative of the reference in the calibration unit; and means for adjusting configurable circuitry connected to the oscillator based on the comparison of the signal indicative of the oscillator and the signal indicative of the reference.

21. The apparatus of claim 20, wherein means for adjusting configurable circuitry comprises means for activating a subset of switched capacitors based on the comparison of the signal indicative of the oscillator and the signal indicative of the reference.

22. The apparatus of claim 20, wherein the initial input parameter is an initial input voltage, the apparatus further comprising:

means for generating the initial input voltage based on temperature.

23. The apparatus of claim 20, wherein means for initializing the first divider and the second divider comprises means for initializing the signal indicative of the oscillator and the signal indicative of the reference such that the signal indicative of the oscillator and the signal indicative of the reference are substantially in phase.

24. The method of claim 23, wherein means for initializing the first divider and the second divider further comprises means for initializing the signal indicative of the oscillator and the signal indicative of the reference at approximately the same time.

25. A non-transitory computer readable storage medium having stored thereon processor-executable software instructions configured to cause a processor to perform operations for calibrating a frequency synthesizer, the operations comprising:

defining an initial frequency of an oscillator for an initial input parameter;

initializing a first divider and a second divider by sending a signal from a calibration unit to each of the first and second dividers;

generating, in the first divider, a signal indicative of the oscillator by scaling an oscillator frequency defined by the initial input parameter;

generating, in the second divider, a signal indicative a reference by scaling a reference frequency;

comparing the signal indicative of the oscillator and the signal indicative of the reference in the calibration unit; and adjusting configurable circuitry connected to the oscillator based on the comparison of the signal indicative of the oscillator and the signal indicative of the reference.

26. The non-transitory computer readable storage medium of claim 25, wherein the stored processor-executable software instructions are configured to cause a processor to perform operations further comprising activating a subset of switched capacitors based on the comparison of the signal indicative of the oscillator and the signal indicative of the reference.

27. The non-transitory computer readable storage medium of claim 25, wherein the stored processor-executable software instructions are configured to cause a processor to perform operations further comprising:

generating the initial input voltage based on temperature.

28. The non-transitory computer readable storage medium of claim 25, wherein the stored processor-executable software instructions are configured to cause a processor to perform operations further comprising initializing the signal indicative of the oscillator and the signal indicative of the reference such that the signal indicative of the oscillator and the signal indicative of the reference are substantially in phase.

29. The method of claim 28, wherein the stored processor-executable software instructions are configured to cause a processor to perform operations further comprising initializing the signal indicative of the oscillator and the signal indicative of the reference at approximately the same time.

* * * * *